United States Patent [19]

Haque

[11] Patent Number: 4,596,954
[45] Date of Patent: Jun. 24, 1986

[54] FREQUENCY DOUBLER WITH FIFTY PERCENT DUTY CYCLE OUTPUT SIGNAL

[75] Inventor: Yusuf A. Haque, San Jose, Calif.

[73] Assignee: American Microsystems, Inc., Santa Clara, Calif.

[21] Appl. No.: 584,656

[22] Filed: Feb. 29, 1984

[51] Int. Cl.[4] ............... H03B 19/10; H03B 5/20
[52] U.S. Cl. ................... 328/20; 307/219.1; 307/471
[58] Field of Search ............... 328/20; 307/219.1, 471

[56] References Cited

U.S. PATENT DOCUMENTS

| | | | |
|---|---|---|---|
| 3,593,156 | 7/1971 | Jordan | 328/20 |
| 3,601,705 | 8/1971 | Germann et al. | 328/55 |
| 3,622,210 | 11/1971 | Thelen | 307/220 |
| 3,648,062 | 3/1972 | Bozoian | 307/220 |
| 3,668,489 | 6/1972 | Erdman | 318/227 |
| 3,710,146 | 1/1973 | Ohsawa | 307/271 |
| 3,721,766 | 3/1973 | Hilbert | 307/271 |
| 3,721,896 | 3/1973 | Mori et al. | 324/238 |
| 3,742,353 | 6/1973 | Parisi | 324/79 D |
| 3,764,927 | 10/1973 | Allinger et al. | 328/20 |
| 3,771,044 | 11/1973 | Cohen et al. | 307/309 |
| 3,786,357 | 1/1974 | Belle Isle | 328/20 |
| 3,947,780 | 3/1976 | Rice et al. | 372/18 |
| 4,042,834 | 8/1977 | Pace | 307/220 |
| 4,048,571 | 9/1977 | Jacobson | 328/20 |
| 4,051,386 | 9/1977 | Long et al. | 307/271 |
| 4,052,626 | 10/1977 | Tuma et al. | 307/271 |
| 4,077,010 | 2/1978 | Ryon | 328/20 |
| 4,101,789 | 7/1978 | Ruhnau | 328/20 |
| 4,439,689 | 3/1984 | Chazenfus | 328/20 |
| 4,446,389 | 5/1984 | Williams et al. | 307/471 |

*Primary Examiner*—John S. Heyman
*Attorney, Agent, or Firm*—Steven F. Caserza; Alan H. MacPherson; Kenneth E. Leeds

[57] ABSTRACT

A unique frequency doubler circuit is utilized which requires only a handful of standard components such as operational amplifier, logic gates, resistors, capacitors and switches. In contrast to certain prior art frequency doublers, frequency doublers constructed in accordance with the teachings of this invention do not require the use of a phase lock loop, thereby resulting in a substantial simplification of circuit construction. Furthermore, frequency doublers constructed in accordance with this invention utilize a feedback technique which assures that the duty cycle of the output signal will be 50%, or any other predefined value.

2 Claims, 8 Drawing Figures

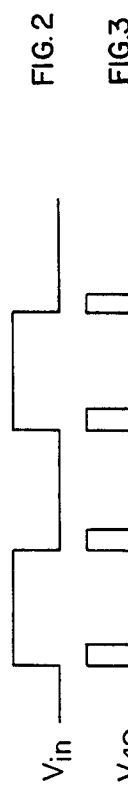
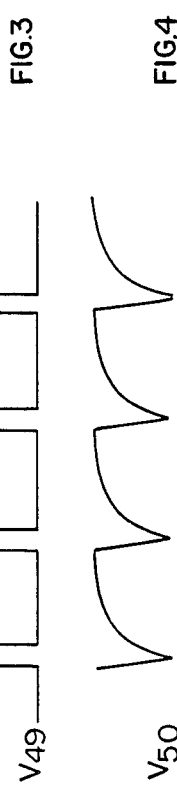
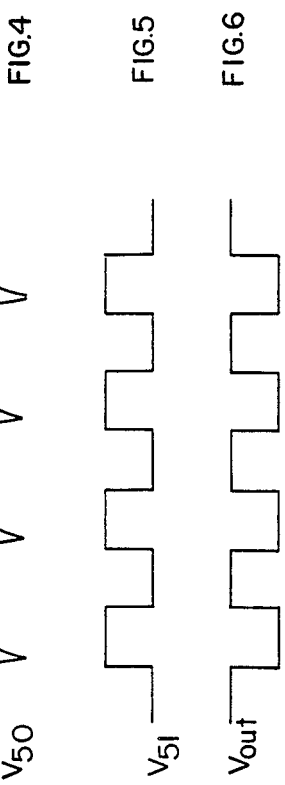
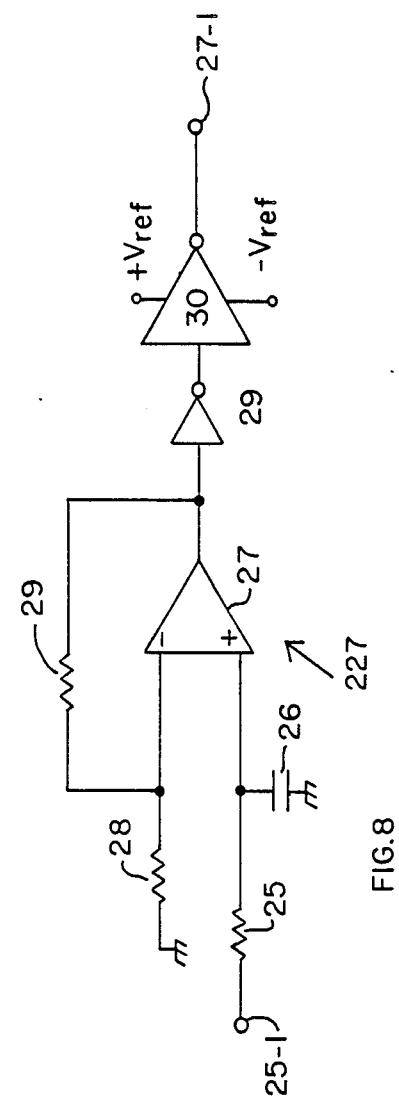
FIG.2
FIG.3
FIG.4
FIG.5
FIG.6
$V_{in}$
$V_{49}$
$V_{50}$
$V_{51}$
$V_{out}$
FIG.8

FREQUENCY DOUBLER WITH FIFTY PERCENT DUTY CYCLE OUTPUT SIGNAL

BACKGROUND OF THE INVENTION

This invention relates to electronic circuits for providing an output signal having a frequency twice that of the input signal.

Frequency doublers are known in the prior art and are used to provide an output signal which has a frequency having twice the frequency of an input signal. Frequency doublers have long been used in radio frequency work; for example, to provide a high-frequency signal which is generated from a crystal or other oscillator having a lower frequency. These require components whose values and tolerances are not readily reproducible in silicon MOS technology.

Frequency doublers can also be constructed utilizing phase lock loops. Use of phase lock loops requires complex circuitry which requires large areas on silicon and results in jitter (i.e., slight, but undesirable, shifts in frequency) in the final output signal. Frequency doublers using phase lock loop are described, for example, in "Phase Lock Techniques" p.78, F. M. Gardner, John Wiley & Sons, Inc. 1966, which is hereby incorporated by reference.

SUMMARY

In accordance with the teachings of this invention, a unique frequency doubler circuit is utilized which requires only a handful of standard components such as operational amplifiers, logic gates, resistors, capacitors and switches. In contrast to certain prior art frequency doublers, frequency doublers constructed in accordance with the teachings of this invention do not require the use of a phase lock loop, thereby resulting in a substantial simplification of circuit construction. Furthermore, frequency doublers constructed in accordance with this invention utilize a feedback technique which assures that the duty cycle of the output signal will be 50%, or any other predefined value.

BRIEF DESCRIPTION OF THE DRAWINGS

FIG. 2 is a graphical representation of the input signal $V_{in}$ applied to the frequency doubler shown in FIG. 1;

FIG. 3 is a graphical representation of the voltage V49 provided at node 49 of the frequency doubler shown in FIG. 1;

FIG. 4 is a graphical representation of the voltage V50 provided at node 50 of the circuit of FIG. 1;

FIG. 5 is a graphical representation of the voltage V51 provided at node 51 of the circuit in FIG. 1;

FIG. 6 is a graphical representation of the output voltage $V_{out}$ provided by the circuit of FIG. 1;

FIG. 8 is one embodiment of an integrator which allows the frequency doubler of this invention to provide an output signal of other than 50% duty cycle.

DETAILED DESCRIPTION

Figure 1:
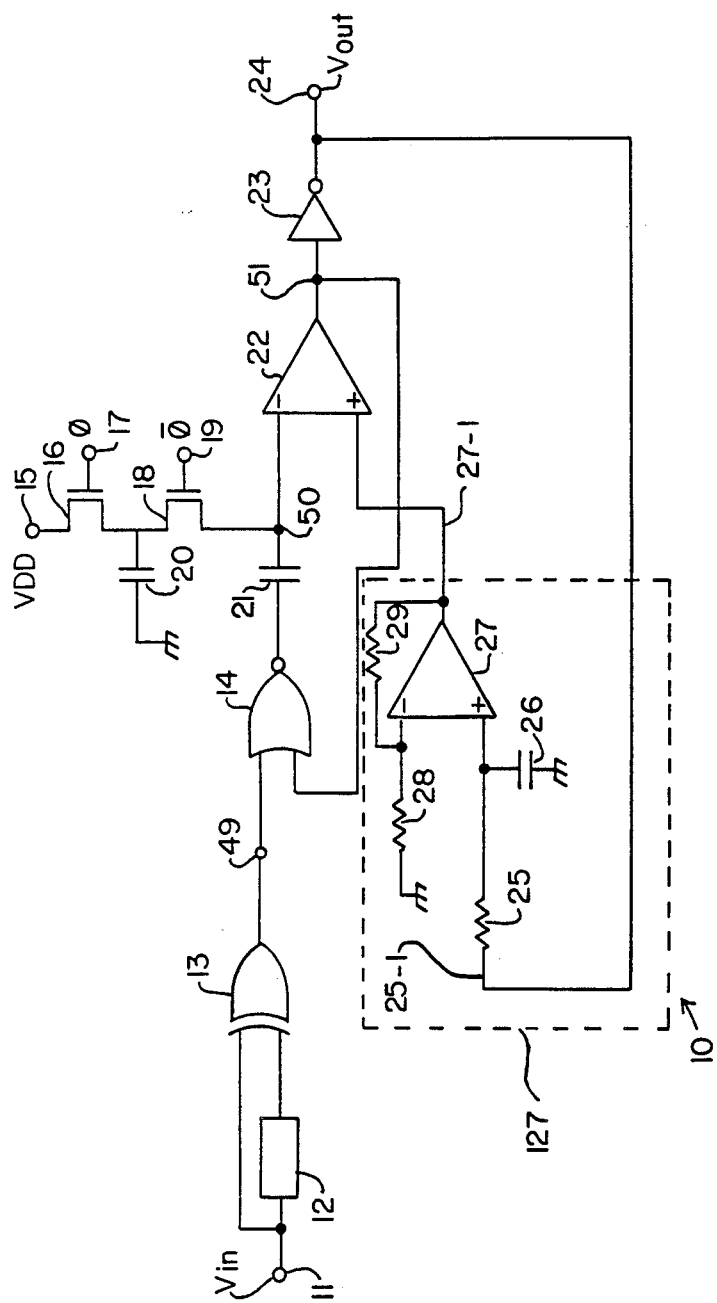
FIG. 1 is a schematic diagram of one embodiment of a frequency doubler constructed in accordance with the teachings of this invention.
Figure 7:
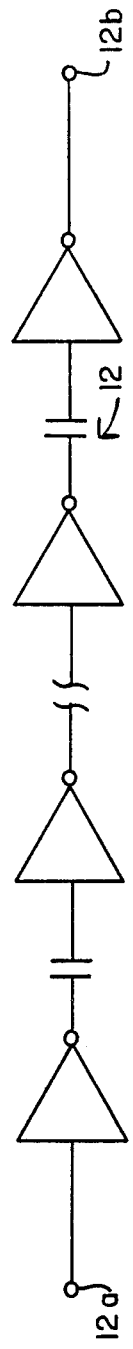
FIG. 7 is one embodiment of a delay means 12 shown in FIG. 1.

One embodiment of a frequency doubler constructed in accordance with the teachings of this invention is shown in the schematic diagram of FIG. 1. Frequency doubler 10 includes input terminal 11 for receiving an input signal $V_{in}$ having a frequency f. Frequency doubler 10 also includes output terminal 24 for providing an output voltage $V_{out}$ having a frequency 2f, double the frequency of the input voltage $V_{in}$. The input signal $V_{in}$ is shown in graphical form in FIG. 2, and is typically within the range of approximately 500 Hz to 3 KHz and has a duty cycle within the range of approximately 30% to 70%. Input signals having higher frequencies can be used, and thus higher frequency output signals provided, if desired. The input signal $V_{in}$ is directly applied to one input lead of exclusive OR gate 13. Input voltage $V_{in}$ is also applied to the input lead 12a of delay means 12, whose output lead 12b is connected to the other input lead of exclusive OR gate 13. Delay means 12 may comprise any suitable delay means, including a chain of inverters with capacitive loading on their output, as is shown in FIG. 7. In one embodiment of this invention, delay means 12 delays the input signal $V_{in}$ by a few microseconds prior to applying the delayed input signal to the second input lead of exclusive OR gate 13. It is generally desired that the delay provided by delay means 12 be sufficient to allow NOR gate 14 to charge its output lead to the negative supply voltage in order to provide a logical zero output signal.

Exclusive OR gate 13 thus provides an output voltage V49 (as shown in FIG. 3) on output node 49. As can be seen from FIG. 3, V49 goes high for a short period of time (approximately equal to the time delay provided by delay means 12) in response to each rising and falling edge of input signal $V_{in}$. Thus, signal V49 has a frequency 2f, twice the frequency of input voltage $V_{in}$. However, signal V49 generally does not have a 50% duty cycle, as is often desired, but has a duty cycle of $$2T_1/T_2$$

where $T_1$ = the delay provided by delay means 12; and
$T_2 = 1/f$ = the period of $V_{in}$.

The remainder of the circuit shown in FIG. 1 serves to provide an output signal $V_{out}$ having a frequency of 2f, and which has a 50% duty cycle.

Terminal 15 is connected to a positive supply voltage Vdd (typically 5 volts). Switches 16 and 18, together with capacitor 20, serve as a switched capacitor resistor equivalent. In the embodiment of this invention shown in FIG. 1, switches 16 and 18 are N channel MOS transistors being controlled by clock signals $\phi$ and $\bar{\phi}$, respectively. Switched capacitor resistor equivalents are well known in the prior art and thus will not be described in detail in this application. A more complete description of the Q operation of a switched capacitor resistor equivalent is given by B. J. Hostica, R. W. Brodersen, P. R. Gray, in "MOS Sampled Data Recursive Filters Using Switched Capacitor Integrators", *IEEE Journal of Solid State Circuits*, December 1977, pps. 600–609, which is hereby incorporated by reference. Clock signals $\phi$ and $\bar{\phi}$ preferably have a frequency $f\phi$ within the range of approximately 10 KHz to 500 KHz where the input signal has a frequency within the range of approximately 1 KHz to 50 KHz. The switched capacitor resistor equivalent formed by switches 16 and 18 and capacitor 20 serves to charge capacitor 21 to supply voltage Vdd with time constant (C21/C20) $f\phi$.

where

C21 is the capacitance of capacitor 21 (typically approximately 20 picofarads);
C20 is the capacitance of capacitor 20 (typically approximately 1 picofarad); and
f$\phi$ is the frequency of clocks $\phi$ and $\overline{\phi}$.

In one embodiment of this invention, a resistor is used in place of switches 17, 19 and capacitor 20. This embodiment requires more area and provides less yield due to greater variations in resistance (where the circuit is implemented using MOS technology) and thus greater variations in the resulting time constant.

The voltage V50 thus generated on terminal 50 is shown in FIG. 4. Capacitor 21 is discharged when NOR gate 14 provides a logical zero output signal which occurs in one instance in response to a logical one output signal from exclusive OR gate 13. Thus, when V49 goes high, the output signal of NOR gate 14 goes low and voltage V50 follows this and is discharged as shown in FIG. 4.

Voltage comparator 22 has its inverting input lead connected to node 50 and its noninverting input lead connected to the output lead of operational amplifier 27. The output signal V51 from comparator 22, which appears on node 51, is positive (logical 1) when V50 is discharged to a value less than the voltage which is provided on the output lead of operational amplifier 27. The output lead of operational amplifier 22 is connected to the input lead of inverter 23, whose output lead is connected to output terminal 24 to provide the output signal $V_{out}$ and, through resistor 25, to the noninverting input lead of operational amplifier 27. Capacitor 26 is connected between the noninverting input lead of operational amplifier 27 and ground. Resistor 28 is connected between ground and the inverting input lead of operational amplifier 27, and resistor 29 is connected between the inverting input lead of operational amplifier 27 and the output lead of operational amplifier 27, thereby causing operational amplifier 27 to have a closed loop gain of $$G = 1 + (R29/R28)$$

where
G = the closed loop gain of operational amplifier 27 (typically 1 to 10);
R28 = the resistance of resistor 28; and
R29 = the resistance of resistor 29.

Capacitor 26 integrates the output voltage $V_{out}$, and operational amplifier 27 provides an amplified signal equal to $G \int V_{out} dt$ to the noninverting input lead of operational amplifier 22.

For stability, the voltage on the output lead of operational amplifier 27 should be relatively constant. This requires that the result of the integration $V_{out} dt$ when $V_{out}$ is high equal the result of the integration of $V_{out} dt$ when $V_{out}$ is low. If this were not so, net current would flow into the integrator and change the output voltage. By providing the negative feedback through operational amplifier 27, the output signal $V_{out}$ maintains a 50% duty cycle. For example, if the output signal $V_{out}$ has a duty cycle less than 50% such that during each cycle $V_{out}$ remains a logical 0 longer than it remains a logical 1, the voltage stored on capacitor 26 will be less than when the duty cycle of $V_{out}$ is 50%. With this decreased voltage applied to the noninverting input lead of operational amplifier 27, operational amplifier 27 provides a decreased output voltage to the noninverting input lead of operational amplifier 22. The output signal V51 from operational amplifier 22 is a logical 0 when the voltage V50 is greater than the output voltage of operational amplifier 27, thereby causing V51 to have a logical 0 value for a greater period of time, which in turn causes the output signal $V_{out}$ to have a logical 1 output signal for an increased period of time. Conversely, if the output signal $V_{out}$ has a duty cycle greater than 50% such that during each cycle $V_{out}$ remains a logical 1 longer than it remains a logical 0, the voltage stored on capacitor 26 will be greater than when the duty cycle of $V_{out}$ is 50%. With this increased voltage applied to the noninverting input lead of operational amplifier 27, operational amplifier 27 provides an increased output voltage to the noninverting input lead of operational amplifier 22. The output signal V51 from operational amplifier 22 is a logical 0 when the voltage V50 is greater than the output voltage of operational amplifier 27, thereby causing V51 to have a logical 0 value for a greater period of time, which in turn causes the output signal $V_{out}$ to have a logical 1 output signal for a increased period of time.

In this manner, the feedback provided by operational amplifier 27 provides output signal $V_{out}$ with a 50% duty cycle.

In an alternative embodiment of my invention, it is desired to provide an output signal $V_{out}$ having other than a 50% duty cycle. In this embodiment of my invention integrator 127 (FIG. 1) is replaced with integrator 227 of FIG. 8. Integrator 227 of FIG. 8 is the same as integrator 127 of FIG. 1, with the addition of inverter 29 and buffer 30. Inverter 29 is an inverter receiving as its input lead the output signal from operational amplifier 27. Buffer 30 is an inverter receiving on its input lead the output signal from inverter 29, and which provides an output signal on output lead 27-1 to the noninverting input lead of operational amplifier 22 (FIG. 1). Buffer 30 is powered by a positive reference voltage +Vref and a negative reference voltage −Vref which are generated in any one of a number of ways well known in the prior art. The magnitudes of +Vref and −Vref are selected to provide the desired duty cycle of the output signal $V_{out}$ provided on output lead 24 (FIG. 1). Thus, the duty cycle is defined as:

$$D = (+Vref)/(|+Vref| + |-Vref|)$$

Thus, if a 60% duty cycle is desired, the magnitude of Vref must be 1.5 times the magnitude of −Vref. Conversely, if a 25% duty cycle is desired, the magnitude of +Vref must be one-third the magnitude of −Vref.

The specific embodiments of this invention described in this specification are intended to serve by way of example and are not a limitation on the scope of my invention. Numerous other embodiments of this invention will become apparent to those of ordinary skill in the art in light of the teachings of this specification.

I claim:
1. A frequency doubler circuit comprising:
an input terminal for receiving an input signal;
an output terminal for providing an output signal having a frequency twice the frequency of said input signal;
a delay means having an input lead connected to said input terminal and having an output terminal;
an exclusive OR gate having a first input lead connected to said input terminal, a second input lead connected to said output lead of said delay means, and an output lead which provides an intermediate signal having twice the frequency of said input signal; and means for adjusting the duty cycle of said intermediate signal to equal a desired duty cycle; and wherein said means for adjusting comprises:

means responsive to said intermediate signal which provides a ramp voltage to increase in magnitude;

means for integrating said ramp voltage, providing an integrated voltage;

means for comparing said ramp voltage and said integrated voltage, thereby providing a logical one output voltage when said ramp voltage is greater than said integrated voltage, and a logical zero output voltage when said ramp voltage is less than said integrated voltage.

2. The structure as in claim 1 wherein:

said means for integrating is powered by a positive voltage source +Vref and a negative voltage source −Vref such that the duty cycle D of said output signal is defined as:

$$D = (+Vref)/(|+Vref| + |-Vref|).$$

* * * * *